United States Patent
Huang et al.

(10) Patent No.: US 11,271,157 B1
(45) Date of Patent: Mar. 8, 2022

(54) PEROVSKITE FILM AND MANUFACTURING METHOD THEREOF

(71) Applicant: Industrial Technology Research Institute, Hsinchu (TW)

(72) Inventors: Kuo-Wei Huang, Yunlin County (TW); Yung-Liang Tung, Hsinchu County (TW); Shih-Hsiung Wu, Tainan (TW); Jen-An Chen, Miaoli County (TW); Pei-Ting Chiu, Kaohsiung (TW); Yu-Hung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 25 days.

(21) Appl. No.: 17/035,681

(22) Filed: Sep. 29, 2020

(30) Foreign Application Priority Data

Aug. 27, 2020 (TW) .................................. 109129316

(51) Int. Cl.
*H01L 51/00* (2006.01)
*B05D 3/06* (2006.01)
(Continued)

(52) U.S. Cl.
CPC ........ *H01L 51/0004* (2013.01); *B05D 3/0218* (2013.01); *B05D 3/067* (2013.01);
(Continued)

(58) Field of Classification Search
CPC .......... B05D 3/0218–0245; B05D 3/06; C09K 11/0827–0833; C09K 11/615–616; H02L 51/0003–0005; H02L 51/0026–0028
See application file for complete search history.

(56) References Cited

U.S. PATENT DOCUMENTS

| 10,151,858 B2 | 12/2018 | Soci et al. |
| 10,249,441 B2 | 4/2019 | Vak et al. |

(Continued)

FOREIGN PATENT DOCUMENTS

| CN | 104022185 | 9/2014 |
| CN | 105789451 | 7/2016 |

(Continued)

OTHER PUBLICATIONS

Li Na Quan et al., "Ligand-Stabilized Reduced-Dimensionality Perovskites," J. Am. Chem. Soc., vol. 138, No. 8, Feb. 2016, pp. 2649-2655.

(Continued)

*Primary Examiner* — Daniel P Shook
(74) *Attorney, Agent, or Firm* — JCIPRNET

(57) ABSTRACT

Provided are a perovskite film and a manufacturing method thereof. The method includes the following steps. A perovskite precursor material is coated in a linear direction on a substrate with a temperature between 100° C. and 200° C., wherein a concentration of the perovskite precursor material is between 0.05 M and 1.5 M. An infrared light irradiation is performed on the perovskite precursor material to cure the perovskite precursor material to form a thin film including a compound represented by formula (1). The perovskite film has a single 2D phase structure or has a structure in which a 3D phase structure is mixed with a single 2D phase structure.

$$(RNH_3)_2MA_{(n-1)}M^1{}_nX_{(3n+1)} \quad \text{formula (1),}$$

wherein the definitions of R, MA, $M^1$, X, and n are as defined above.

13 Claims, 16 Drawing Sheets

(51) Int. Cl.
*B05D 3/02* (2006.01)
*H01L 51/42* (2006.01)

(52) U.S. Cl.
CPC .......... *H01L 51/0026* (2013.01); *H01L 51/42* (2013.01); *H01L 2251/10* (2013.01); *H01L 2251/30* (2013.01)

(56) References Cited

U.S. PATENT DOCUMENTS

| | | | |
|---|---|---|---|
| 10,476,017 B2 | 11/2019 | Kanatzidis et al. | |
| 2017/0054099 A1* | 2/2017 | Friend | ................ H01L 51/5092 |
| 2020/0381642 A1* | 12/2020 | Christensen | ........ H01L 51/4213 |

FOREIGN PATENT DOCUMENTS

| | | |
|---|---|---|
| CN | 109860428 | 6/2019 |
| CN | 109980095 | 7/2019 |
| CN | 110783467 | 2/2020 |
| TW | 200826554 | 6/2008 |
| TW | I485154 | 5/2015 |
| TW | I560148 | 12/2016 |
| TW | 201709540 | 3/2017 |
| TW | I583011 | 5/2017 |
| TW | I598319 | 9/2017 |
| TW | 201900950 | 1/2019 |
| WO | 2019075024 | 4/2019 |
| WO | 2019138095 | 7/2019 |

OTHER PUBLICATIONS

Ravi K. Misra et al., "Low-Dimensional Organic-Inorganic Halide Perovskite: Structure, Properties, and Applications," ChemSusChem, vol. 10, Issue 19, Jul. 13, 2017, pp. 3712-3721.

Lu Zhang et al., "Two dimensional metal halide perovskites: Promising candidates for light-emitting diodes," Journal of Energy Chemistry, vol. 37, Oct. 2019, pp. 97-110.

Xiaolei Yang et al., "Efficient green light-emitting diodes based on quasi-two-dimensional composition and phase engineered perovskite with surface passivation," Nature Communications, vol. 9, No. 570, Feb. 2018, pp. 1-8.

Shih-Hsiung Wu, et al., "Method for Forming Perovskite Layer and Forming Structure Comprising Perovskite Layer," Unpublished U.S. Appl. No. 16/708,446, filed Dec. 10, 2019.

"Office Action of Taiwan Counterpart Application", dated Aug. 4, 2021, p. 1-p. 5.

* cited by examiner

PEROVSKITE FILM AND MANUFACTURING METHOD THEREOF

CROSS-REFERENCE TO RELATED APPLICATION

This application claims the priority benefit of Taiwan application serial no. 109129316, filed on Aug. 27, 2020. The entirety of the above-mentioned patent application is hereby incorporated by reference herein and made a part of this specification.

TECHNICAL FIELD

The disclosure relates to a perovskite film and a manufacturing method thereof.

BACKGROUND

Because perovskite materials are good photoelectric materials, they are widely used in solar cells. Generally speaking, in the process of forming a perovskite film on a substrate, a perovskite precursor material coated on the substrate is heated to volatilize the solvent in the perovskite precursor material and react the perovskite precursor to form the perovskite film.

However, when the perovskite material is mass-produced in a large area, the use of a heating plate to provide energy from below the substrate causes the issue of uneven heating temperature, thus resulting in poor quality of the perovskite film.

In addition, generally speaking, the perovskite film may have a 2D structure or may have a structure in which a 3D phase structure is mixed with a 2D phase structure (2D/3D), wherein the 2D structure may exhibit the excellent photoelectric properties thereof, and the 2D/3D structure may have characteristics such as high open circuit voltage (Voc), high photoelectric efficiency, and high stability. However, in the prior art, it is generally not easy to form a perovskite film with a single 2D structure due to the time consumption and the control and requirements for the process environment are very strict. Therefore, perovskite films with at least two 2D structures are mostly manufactured and used at present.

SUMMARY

The perovskite film of the disclosure includes the following steps. A perovskite precursor material is coated in a linear direction on a substrate with a temperature between 100° C. and 200° C., wherein a concentration of the perovskite precursor material is between 0.05 M and 1.5 M. The perovskite precursor material is irradiated with an infrared light to cure the perovskite precursor material to form a thin film including a compound represented by formula (1). The perovskite film has a single 2D phase structure or has a structure in which a 3D phase structure is mixed with a single 2D phase structure.

$$(RNH_3)_2MA_{(n-1)}M^1{}_nX_{(3n+1)} \quad \text{formula (1)},$$

wherein each R is independently H, a $C_1$ to $C_{20}$ alkyl group, a $C_1$ to $C_{20}$ cycloalkyl group, a $C_1$ to $C_{20}$ carboxyl group, or a $C_1$ to $C_{20}$ aralkyl group; MA is methylamine; $M^1$ is Ca, Sr, Cd, Cu, Ni, Mn, Fe, Co, Pd, Ge, Sn, Pb, Yb, Eu, or a combination thereof; X is Cl, Br, I, or a combination thereof; n is an integer of 1 to 50.

The perovskite film of the disclosure has a single 2D phase structure. The perovskite film includes a compound represented by formula (1), $$(RNH_3)_2MA_{(n-1)}M^1{}_nX_{(3n+1)} \quad \text{formula (1)},$$

wherein each R is independently H, a $C_1$ to CM alkyl group, a $C_1$ to $C_{20}$ cycloalkyl group, a $C_1$ to $C_{20}$ carboxyl group, or a $C_1$ to $C_{20}$ aralkyl group; MA is methylamine; $M^1$ is Ca, Sr, Cd, Cu, Ni, Mn, Fe, Co, Pd, Ge, Sn, Pb, Yb, Eu, or a combination thereof; X is Cl, Br, I, or a combination thereof; n is an integer of 1 to 50. In a photoluminescence spectrum of the perovskite film, a peak appears in a wavelength range of 550 nm to 650 nm, and an FWHM thereof is between 20 nm and 40 nm, or a peak appears in a wavelength range of 700 nm to 800 nm, and an FWHM thereof is between 30 nm and 65 nm.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 3 is a photoluminescence spectrum of a perovskite film of Experimental example 4.

DETAILED DESCRIPTION OF DISCLOSED EMBODIMENTS

Hereinafter, when a numerical range is provided, every numerical value between the upper limit and the lower limit of the range and the upper limit and the lower limit are all included in the scope of the disclosure.

Figure 1:
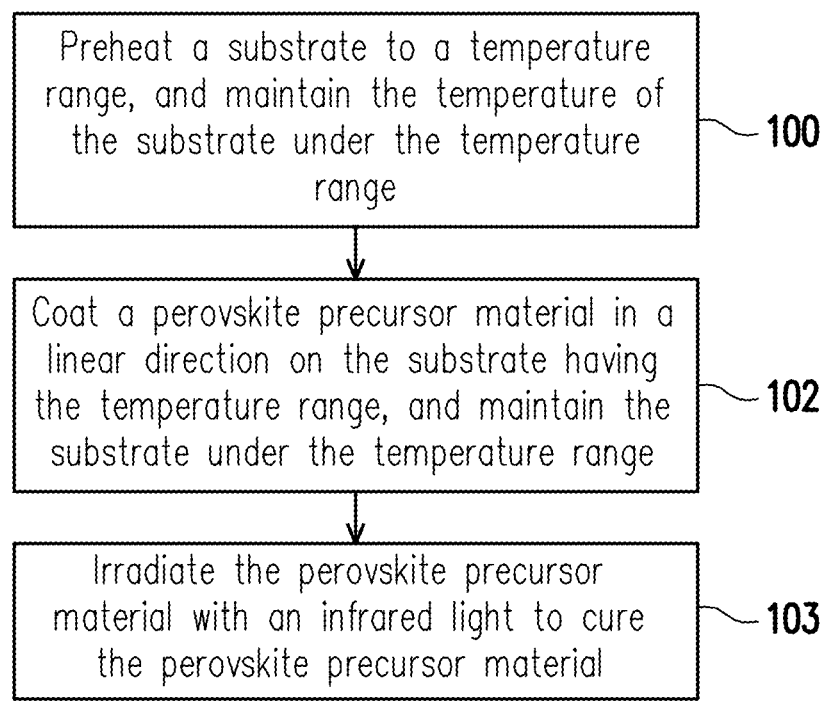
FIG. 1 is a flowchart of a forming method of a perovskite layer shown according to an embodiment of the disclosure.

FIG. 1 is a flowchart of a forming method of a perovskite layer shown according to an embodiment of the disclosure. Referring to FIG. 1, in step 100, a substrate is preheated to a temperature range, and the temperature of the substrate is maintained within the temperature range. In the present embodiment, the substrate is heated to a temperature range between 100° C. and 200° C. For example, the substrate may be heated to 100° C., 110° C., 120° C., 130° C., 140° C., 150° C., 160° C., 170° C., 180° C., 190° C., or 200° C. The temperature range may allow the solvent in the perovskite precursor material to volatilize to generate crystal nuclei, and cause the perovskite precursor to react to gradually grow a dense perovskite thin film. In addition, in the present embodiment, the method of preheating the substrate is, for example, placing the substrate in an environment within the temperature range, or placing the substrate on a heating plate and performing heating to the temperature range.

In step 102, the perovskite precursor material is coated in a linear direction on a substrate having the temperature range (between 100° C. and 200° C.), and the substrate is maintained under the temperature range. In the present embodiment, the concentration of the perovskite precursor material is between 0.05 M and 1.5 M, wherein the concentration of the perovskite precursor material is defined by the concentration of $M_1X_2$ and/or $RNH_3X$. The definitions of R, $M^1$, and X are as follows. For example, the concentration of the perovskite precursor material may be 0.05 M, 0.1 M, 0.15 M, 0.2 M, 0.25 M, 0.3 M, 0.4 M, 0.5 M, 0.6 M, 0.7 M, 0.8 M, 0.9 M, 1 M, 1.05 M, 1.1 M, 1.2 M, 1.3 M, 1.4 M, or 1.5 M. In the present embodiment, the method of coating the perovskite precursor material in a linear direction is, for example, slit coating, blade coating, air knife coating, or inkjet coating instead of the commonly used spin-coating method (not coating along a single direction), and the object is to make the perovskite precursor material uniformly distributed on the substrate to facilitate the growth of the perovskite layer. In an embodiment, via the blade coating method, the surface of the perovskite film is smoother, and the thickness of the perovskite film may be better controlled by adjusting the blade gap. In addition, the blade coating method has the advantages of simple manufacture and low equipment cost.

In addition, in the present embodiment, the perovskite precursor material is soluble in organic solvents to facilitate uniform coating on the substrate. The organic solvent may be γ-butyrolactone (GBL), dimethyl sulfoxide (DMSO), dimethylformamide (DMF), or a mixture thereof. In an embodiment, the organic solvent is dimethyl sulfoxide and dimethyl formamide.

It should be mentioned that, because the spin coating method uses an anti-solvent to remove the solvent, the use rate of the coating solution is too low (about 2%), and the thickness of the resulting film is at least about 400 nm. Therefore, the film may not be used as a material of the active layer of a light-emitting diode (LED), and the spin coating method that is not applied in a linear direction is not suitable for the disclosure.

In step 103, the perovskite precursor material is irradiated with infrared light to cure the perovskite precursor material to form a perovskite film. In the present embodiment, when the perovskite precursor material is coated on the substrate, the perovskite precursor material is simultaneously irradiated with infrared light. In the present embodiment, infrared light is irradiated from above the perovskite precursor material, so that both the top surface and the bottom surface of the perovskite precursor material may be heated to facilitate the rapid growth of crystal nuclei. In detail, since the perovskite precursor material is properly heated by the substrate heating and infrared light irradiation at the same time, the solvent in the perovskite precursor material may be quickly volatilized to produce crystal nuclei, and the perovskite precursor may be reacted to be gradually cured and to grow a dense perovskite thin film. Moreover, the perovskite film has a single 2D phase structure or a structure in which a 3D phase structure is mixed with a single 2D phase structure. In addition, the perovskite film includes a compound represented by formula (1),

$$(RNH_3)_2 MA_{(n-1)} M^1_n X_{(3n+1)} \qquad \text{formula (1)},$$

wherein each R is independently H, a $C_1$ to CM alkyl group, a $C_1$ to $C_{20}$ cycloalkyl group, a $C_1$ to $C_{20}$ carboxyl group, or a $C_1$ to $C_{20}$ aralkyl group; MA is methylamine; $M^1$ is Ca, Sr, Cd, Cu, Ni, Mn, Fe, Co, Pd, Ge, Sn, Pb, Yb, Eu, or a combination thereof; X is Cl, Br, I, or a combination thereof; n is an integer of 1 to 50. For example, n may be 2, 5, 10, 15, 20, 25, 30, 35, 40, or 45. That is, in the present embodiment, the perovskite film at least includes 2D halide perovskite.

In the present embodiment, for example, infrared light with a wavelength between 700 nm and 1400 nm is used for irradiation. In the present embodiment, after the coating of the perovskite precursor material is completed, the infrared light irradiation may continue for a period of time. For example, the time of infrared light irradiation is, for example, between 5 seconds and 120 seconds. For example, the time of the infrared light irradiation may be 5 seconds, 10 seconds, 15 seconds, 20 seconds, 25 seconds, 30 seconds, 35 seconds, 40 seconds, 45 seconds, 50 seconds, 60 seconds, 70 seconds, 80 seconds, 90 seconds, 100 seconds, 110 seconds, or 120 seconds. At this time, the substrate is still maintained at the temperature range. That is to say, in the present embodiment, when the substrate is maintained at the temperature range, the perovskite precursor material may be coated and infrared light irradiation may be performed simultaneously, and after the perovskite precursor material is coated, heating may still be performed simultaneously from above and below the perovskite precursor material. After the infrared light irradiation is finished, an annealing treatment may be further performed to form a perovskite film with better quality. In the present embodiment, the temperature of the annealing treatment is, for example, between 80° C. and 130° C., and the time thereof is, for example, between 30 minutes and 130 minutes. For example, the temperature of the annealing treatment may be 80° C. 90° C., 100° C., 110° C., 120° C., or 130° C., and the time thereof may be 30 minutes, 40 minutes, 50 minutes, 60 minutes, 70 minutes, 80 minutes, 90 minutes, 100 minutes, 110 minutes, 120 minutes, 130 minutes, 140 minutes, or 150 minutes. In another embodiment of the disclosure, the temperature of the annealing treatment is, for example, between 80° C. and 110° C., and the time thereof is, for example, between 50 minutes and 100 minutes.

In the present embodiment, the concentration of the perovskite precursor material is adjusted, and a perovskite film with a single 2D phase structure or a perovskite film with a structure in which a 3D phase structure is mixed with a single 2D phase structure may be formed. Further description is provided below.

When the concentration of the perovskite precursor material is between 0.05 M and 0.6 M, the perovskite film formed by the above steps has a single 2D phase structure. That is, the perovskite film has a 2D phase structure having characteristics such as emitting high-purity light and low cost, and is suitable as a material for the active layer of a light-emitting diode (LED). For example, when the concentration of the perovskite precursor material is between 0.2 M and 0.6 M, infrared light is irradiated for a time between 5 seconds and 20 seconds in step 103, and the perovskite film may be used as the active layer material of a red light diode. In addition, when the concentration of the perovskite precursor material is less than 0.2 M, infrared light is irradiated for a time between 60 seconds and 120 seconds in step 103, and the perovskite film may be used as the active layer material of a green light diode.

The photoluminescence (PL) spectrum identification of the perovskite film formed by the perovskite precursor material with a concentration less than or equal to 0.6 M shows that:

(1) When the concentration of the perovskite precursor material is between 0.2 M and 0.6 M, the photoluminescence spectrum of the perovskite film has a peak in the wavelength range of 700 nm to 800 nm, and the full width at half maximum (FWHM) thereof is between 30 nm and 65 nm. In other words, when the perovskite film is used as the active layer material of the light-emitting diode, the light-emitting diode may emit high-purity red light.

(2) When the concentration of the perovskite precursor material is less than 0.2 M, the photoluminescence spectrum of the perovskite film has a peak in the wavelength range of 550 nm to 650 nm, and the full width at half maximum (FWHM) thereof is between 20 nm and 40 nm. In other words, when the perovskite film is used as the active layer material of the light-emitting diode, the light-emitting diode may emit high-purity green light.

In addition, when the concentration of the perovskite precursor material is greater than 0.6 M and not more than 1.5 M, infrared light is irradiated for a time between 5 seconds and 40 seconds in step 103 to form a perovskite film with a 3D phase and a single 2D phase structure. That is, the perovskite film has a mixed structure of a 3D phase and one kind of 2D phase and has characteristics such as high open circuit voltage, high photoelectric conversion efficiency, and high stability, and is suitable as a material of the active layer of a solar cell.

Based on the above, an embodiment of the disclosure provides a perovskite film with a single 2D phase structure, and the perovskite film includes a compound represented by formula (1),

$$(RNH_3)_2MA_{(n-1)}M^1{}_nX_{(3n+1)} \qquad \text{formula (1)},$$

wherein each R is independently H, a $C_1$ to CM alkyl group, a $C_1$ to $C_{20}$ cycloalkyl group, a $C_1$ to $C_{20}$ carboxyl group, or a $C_1$ to $C_{20}$ aralkyl group; MA is methylamine; $M^1$ is Ca, Sr, Cd, Cu, Ni, Mn, Fe, Co, Pd, Ge, Sn, Pb, Yb, Eu, or a combination thereof; X is Cl, Br, I, or a combination thereof; n is an integer of 1 to 50.

In addition, for the perovskite film of an embodiment of the disclosure, in the photoluminescence spectrum, a peak appears in the wavelength range of 550 nm to 650 nm, and the FWHM thereof is between 20 nm and 40 nm, or a peak appears in the wavelength range of 700 nm to 800 nm, and the FWHM thereof is between 30 nm and 65 nm. In an embodiment, the thickness of the perovskite film is between 5 nm and 4 μm.

Hereinafter, the perovskite film and the manufacturing method thereof of the disclosure are described with experimental examples and comparative examples.

Experimental Example 1

Preparation of Perovskite Precursor Material 0.1 M PEAI (phenethylammonium iodide) was dissolved in a mixed solvent with a ratio of DMF and DMSO of 100:7. Then, 0.05 M MAI (methylammonium iodide) and 0.1 M $PbI_2$ were added, stirred, and heated at 70° C. until completely dissolved. Next, the solution was filtered with a syringe filter with an aperture size of 0.45 μm. Then, the perovskite precursor material was configured to a concentration of 0.1 M (defined by the concentrations of $PbI_2$ and PEAI).

Manufacture of Perovskite Film

First, the substrate was placed on a heating plate to preheat for 10 minutes and the temperature was maintained at ISO ° C. Then, the perovskite precursor material was added (amount of addition was 70 μL) and a blade was immediately activated to coat the perovskite precursor material on the preheated substrate. At this time, the blade speed was 15 mm/s, and the gap between the blade heads was between 50 μm and 150 μm. In addition, irradiation was simultaneously performed with infrared light with a wavelength between 700 nm and 1400 nm. The distance from the infrared light source to the substrate was about 10 cm. After the coating was completed, the infrared light continued to be irradiated for 60 seconds or 120 seconds and then removed. Then, the perovskite film was moved onto a 100° C. heating plate for annealing for 1 hour to form a perovskite film. The perovskite film included a compound represented by chemical formula $(RNH_3)_2MA_{(n-1)}M^1{}_nX_{(3n+1)}$, wherein $RNH_3$ is phenethylamine (PEA), MA is methylamine, $M^1$ is Pb, X is I, and n=2.

Comparative Example 1

Other than that infrared light was not irradiated during the manufacturing process, the same materials and the same manufacturing steps and manufacturing conditions as in Experimental example 1 were used.

Figure 2A:
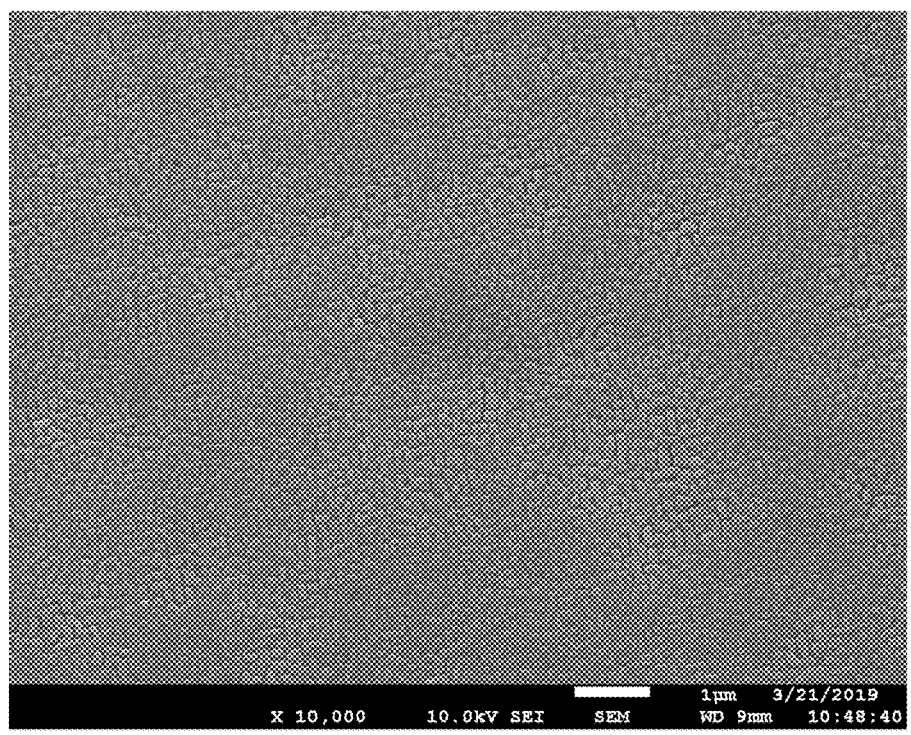
FIG. 2A and FIG. 2B are scanning electron microscope (SEM) images of a perovskite film irradiated with infrared light for 60 seconds and 120 seconds in Experimental example 1, respectively.
Figure 2B:
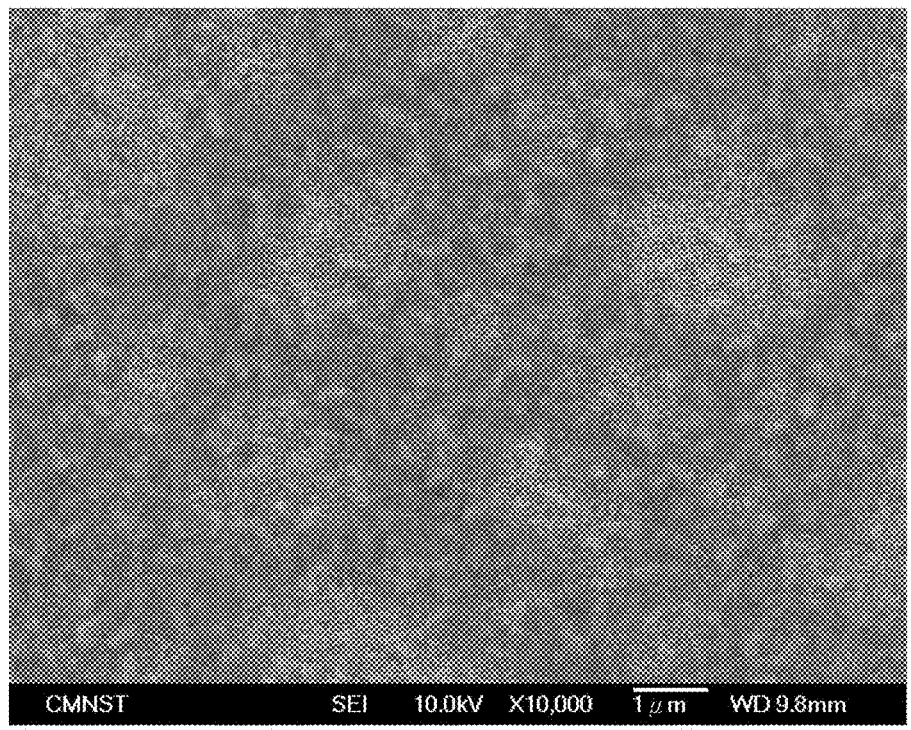
Figure 2C:
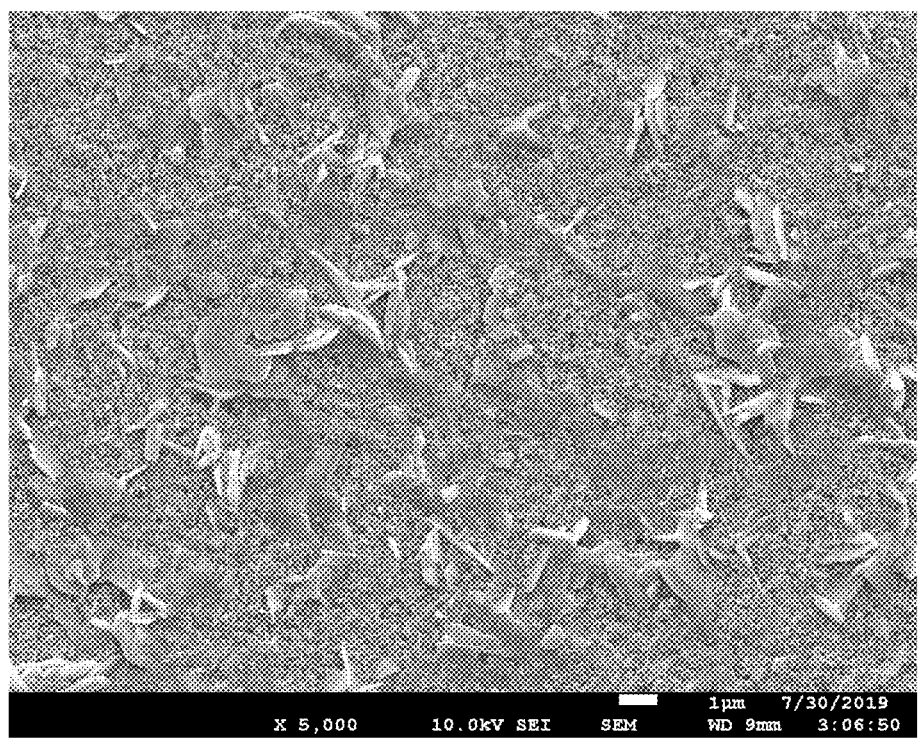
FIG. 2C is an SEM image of a perovskite film in Comparative example 1 without infrared light irradiation.

FIG. 2A and FIG. 2B are SEM images of a perovskite film irradiated with infrared light for 60 seconds and 120 seconds in Experimental example 1, respectively. FIG. 2C is an SEM image of a perovskite film in Comparative example 1 without infrared light irradiation. From FIG. 2A to FIG. 2C, it may be seen that the perovskite film formed in Experimental example 1 was more uniform and had better film forming quality, and in Comparative example 1, the surface was broken and a film may not be formed.

Experimental Example 2

Other than that the gap of the blade heads was 50 μm and the infrared light irradiation was 60 seconds during the manufacturing process, the same materials and the same manufacturing steps and manufacturing conditions as in Experimental example 1 were used.

Comparative Example 2

Other than that blade coating was replaced by spin coating (the speed was first at 2000 rpm for 10 seconds, and then at 6000 rpm for 30 seconds), an anti-solvent (ethyl acetate) was used to form a film, the amount of addition was 200 μL, and no infrared light irradiation was performed, the same materials and the same manufacturing steps and manufacturing conditions as in Experimental example 1 were used. In addition, when the rotation speed was 6000 rpm, the anti-solvent was slowly added dropwise from the top of the substrate after 15 seconds of rotation to make the perovskite reach a supersaturated state.

Figure 3A:
FIG. 3A and FIG. 3B are SEM cross-sectional views of perovskite films of Experimental example 2 and Comparative example 2, respectively.
Figure 3B:
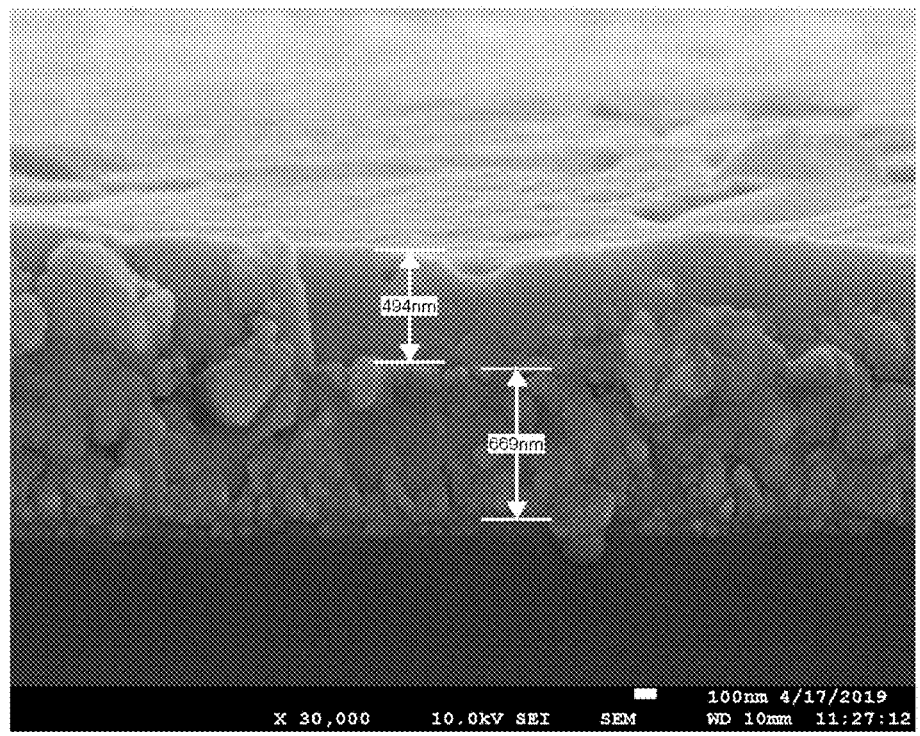

FIG. 3A and FIG. 3B are SEM cross-sectional views of perovskite films of Experimental example 2 and Comparative example 2, respectively. It may be seen from FIG. 3A and FIG. 3B that compared to the perovskite film of Comparative example 2 (thickness of 494 nm), the perovskite film of Experimental example 2 may have a thickness of less than 200 nm (thickness of 134 nm) and may be used as a material of the active layer of a light-emitting element.

Experimental Example 3

Other than that a perovskite precursor material with an n of 5 and a concentration of 0.5 M was used and the infrared light irradiation was 10 seconds during the manufacturing process, the same materials and the same manufacturing steps and manufacturing conditions as in Experimental example 1 were used.

First, an ITO substrate was respectively cleaned with a solvent such as detergent, deionized water, acetone, alcohol, and IPA. After the substrate was dried, the surface of the ITO substrate was treated with UV-$O_3$, and then a p-type semiconductor layer (PEDOT:PSS) solution was coated on the ITO substrate, and annealing was performed at 150° C. for 15 minutes. After the ITO substrate was allowed to stand and cool, the perovskite precursor material was coated by a blade coating method and annealed at 100° C. for 60 minutes. Then, the resulting thin film was placed in a vacuum deposition chamber to vacuum-deposit an n-type semiconductor thin film (2,2',2"-(1,3,5-benzinetriyl)-tris(1-phenyl-1-H-benzimidazole) (TPBi)). Then, an electrode (LiF/Ag) was deposited on the n-type semiconductor thin film.

Figure 4:
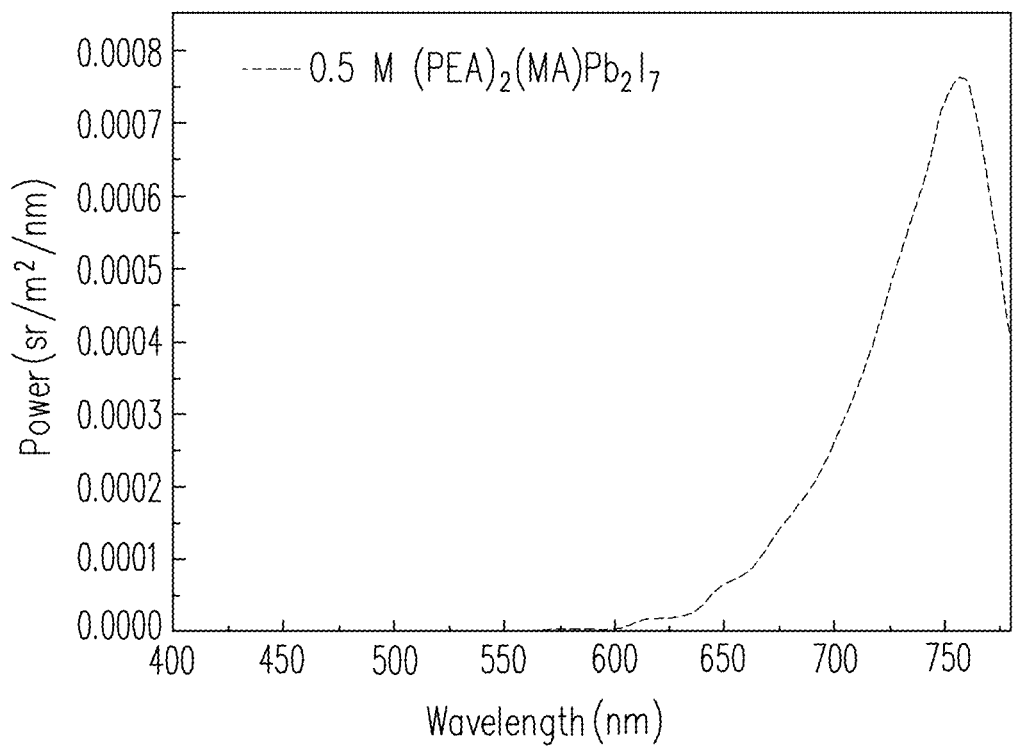
FIG. 4 is a photoluminescence spectrum of a perovskite film of Experimental example 3.

FIG. 4 is a photoluminescence spectrum of a perovskite film of Experimental example 3. It may be seen from FIG. 4 that the perovskite film had a peak in the wavelength range of 700 nm to 800 nm, the FWHM thereof was 61 nm, and the perovskite film may be used as the active layer material of a red light diode.

Experimental Example 4

Other than that infrared light irradiation was 60 seconds during the manufacturing process, the same materials and the same manufacturing steps and manufacturing conditions as in Experimental example 1 were used.

First, an ITO substrate was respectively cleaned with a solvent such as detergent, deionized water, acetone, alcohol, and IPA. After the substrate was dried, the surface of the ITO substrate was treated with UV-$O_3$, and then a p-type semiconductor layer (PEDOT:PSS) solution was coated on the ITO substrate, and annealing was performed at 150° C. for 15 minutes. After the ITO substrate was allowed to stand and cool, the perovskite precursor material was coated by a blade coating method and annealed at 100° C. for 60 minutes. Then, the resulting thin film was placed in a vacuum deposition chamber to vacuum-deposit an n-type semiconductor thin film (2,2',2"-(1,3,5-benzinetriyl)-tris(1-phenyl-1-H-benzimidazole (TPBi)). Then, an electrode (LiF/Ag) was deposited on the n-type semiconductor thin film.

Figure 5:
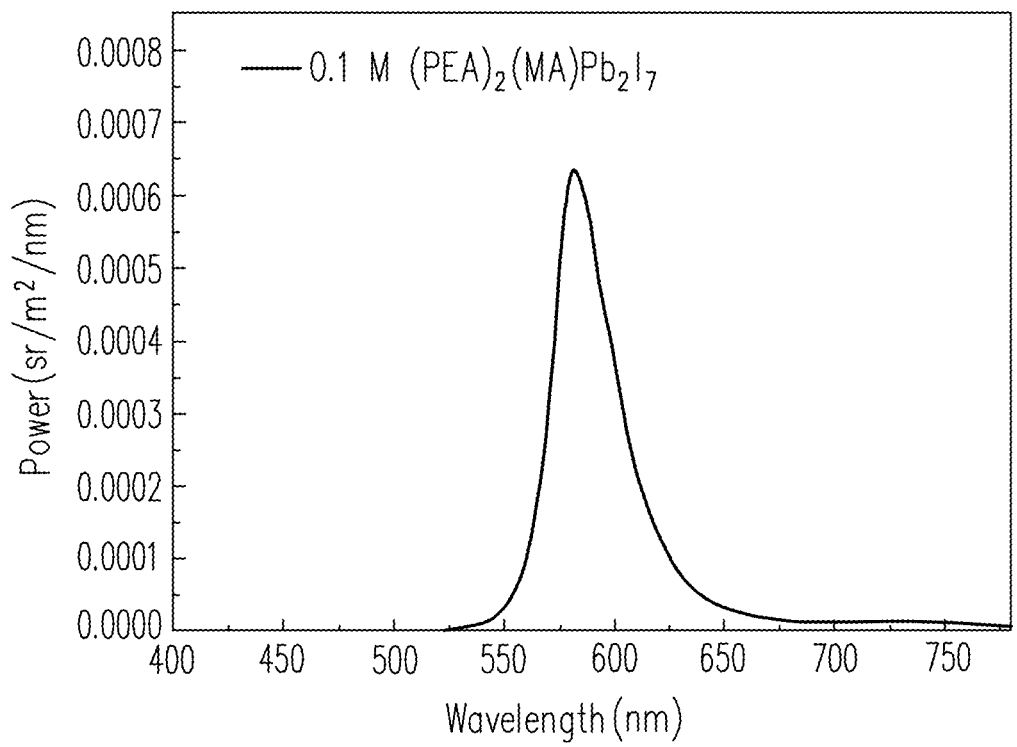

FIG. 5 is a photoluminescence spectrum of a perovskite film of Experimental example 4. It may be seen from FIG. 5 that the perovskite film had a peak in the wavelength range of 550 nm to 650 nm, the FWHM thereof was 33 nm, and the perovskite film may be used as the active layer material of a green light diode.

Experimental Example 5

Other than that a perovskite precursor material with an n of 30 and a concentration of 1 M was used, the gap of the blade heads was 450 μm, the amount of addition was 90 μL, and the infrared light irradiation was 10 seconds during the manufacturing process, the same materials and the same manufacturing steps and manufacturing conditions as in Experimental example 1 were used.

Comparative Example 3

Other than that blade coating was replaced by spin coating (the speed was first at 2000 rpm for 10 seconds, and then at 6000 rpm for 30 seconds), an anti-solvent (ethyl acetate) was used to form a film, the amount of addition was 200 μL, and no infrared light irradiation was performed, the same materials and the same manufacturing steps and manufacturing conditions as in Experimental example 5 were used. In addition, when the rotation speed was 6000 rpm, the anti-solvent was slowly added dropwise from the top of the substrate after 15 seconds of rotation to make the perovskite reach a supersaturated state.

Comparative Example 4

Other than that blade coating was replaced by spray coating (nozzle height was 5 cm), the substrate temperature was maintained at 180° C., and the amount of addition was 250 μL, the same materials and the same manufacturing steps and manufacturing conditions as in Experimental example 5 were used.

Figure 6A:
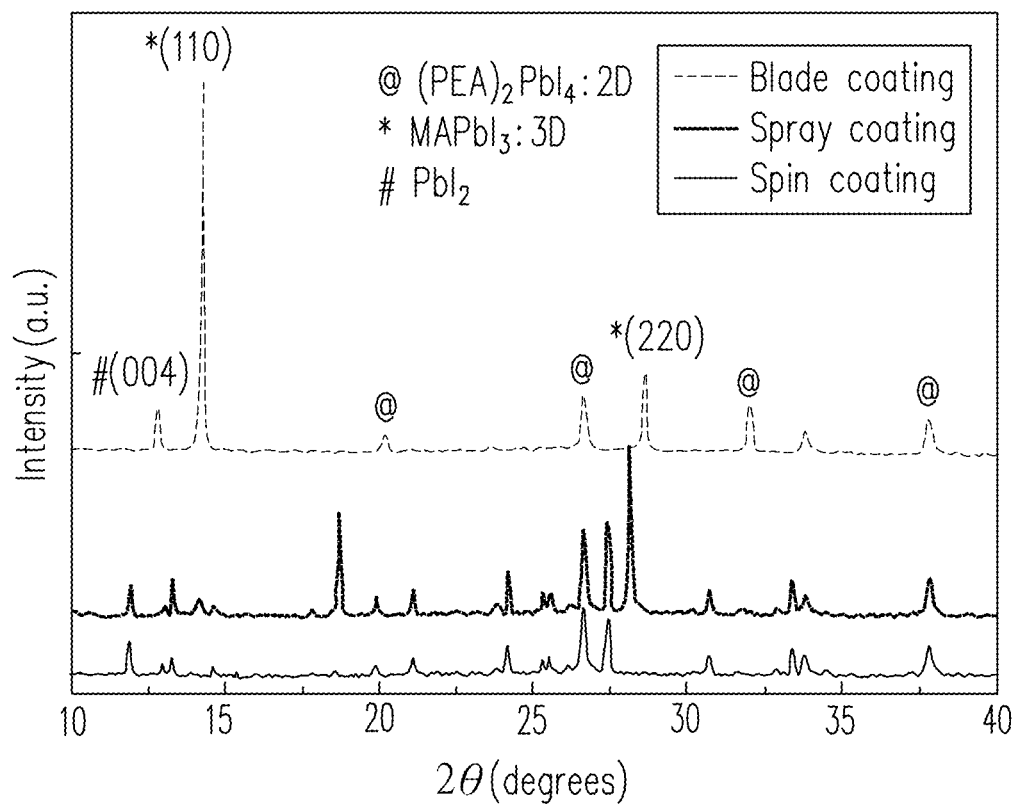
FIG. 6A is an XRD spectrum diagram of perovskite films of Experimental example 3, Comparative example 3, and Comparative example 4.
Figure 6B:
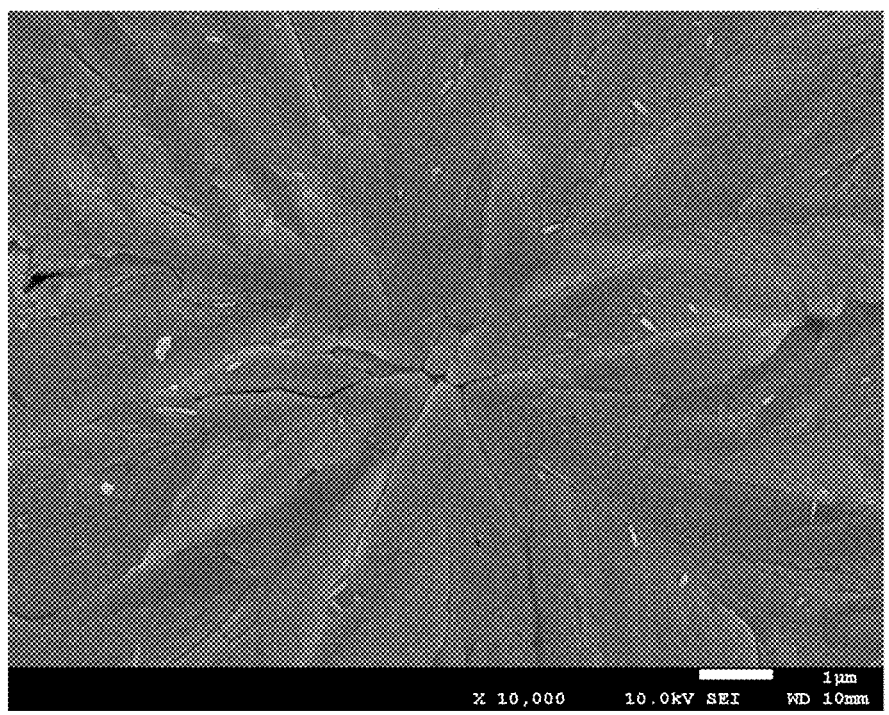
FIG. 6B to FIG. 6D are SEM images of Experimental example 3, Comparative example 3, and Comparative example 4, respectively.
Figure 6C:
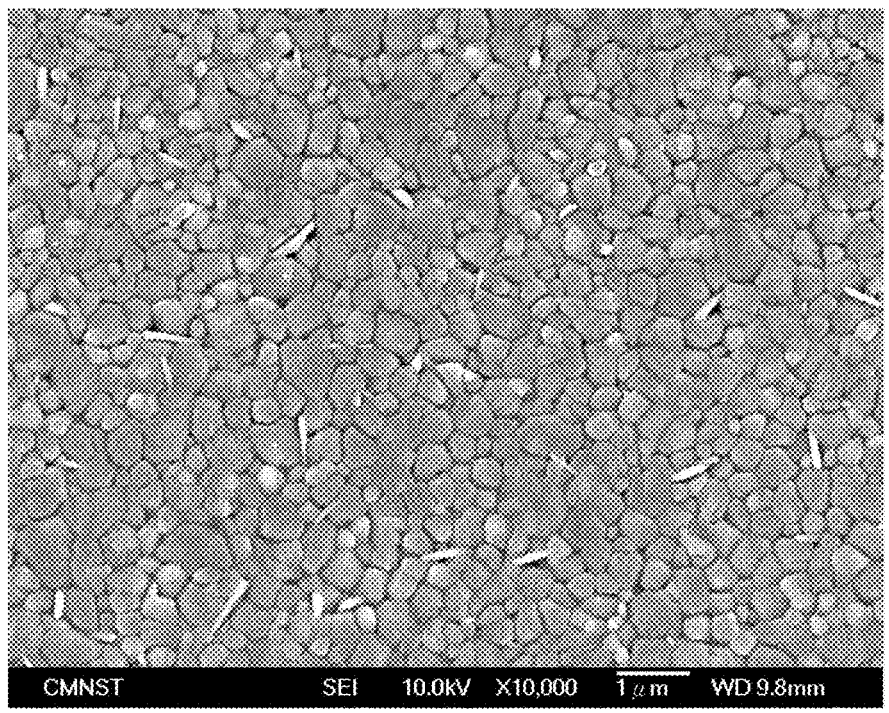
Figure 6D:
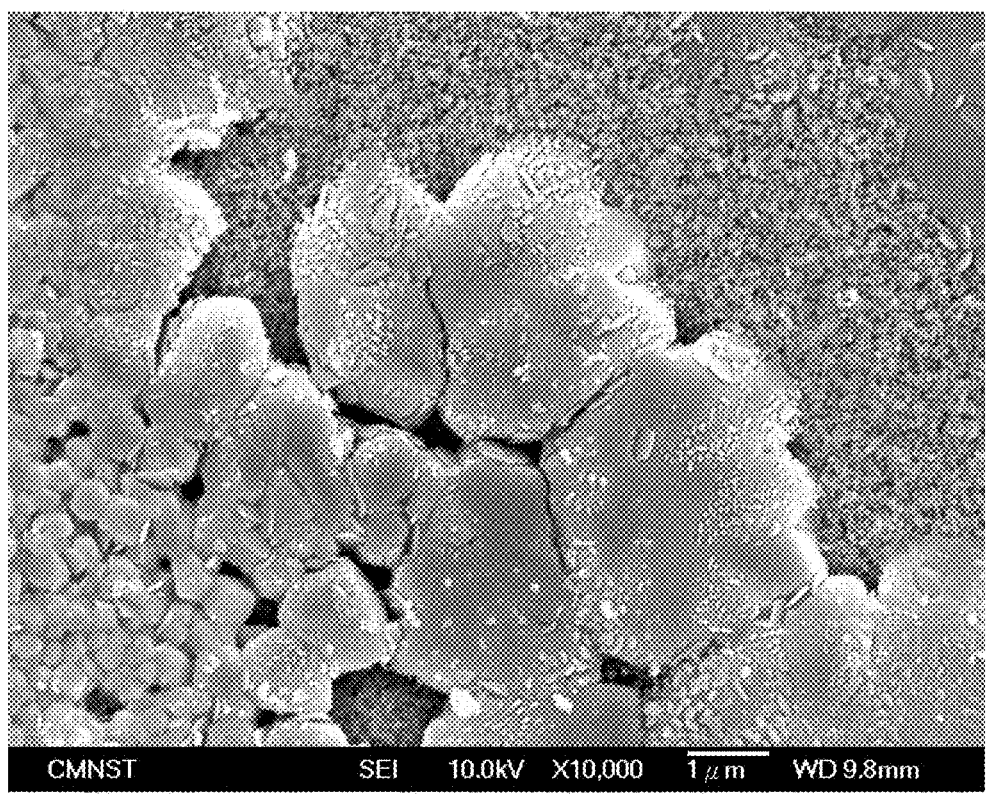

FIG. 6A is an XRD diagram of perovskite films of Experimental example 5, Comparative example 3, and Comparative example 4. It may be seen from FIG. 6A that the perovskite film of Experimental example 5 had a structure in which a 3D phase structure (labeled MAPbI$_3$ in the figure) was mixed with a single 2D phase structure (labeled (PEA)$_2$PbI$_4$ in the figure), and the perovskite films of Comparative example 3 and Comparative example 4 had a structure in which a 3D phase structure was mixed with a plurality kinds of 2D phase structures. In addition, FIG. 6B to FIG. 6D are SEM images of Experimental example 5, Comparative example 3, and Comparative example 4, respectively. It may be seen from FIG. 6B to FIG. 6D that the perovskite film of Experimental example 5 had larger particles and was uniformly formed, and the thin films formed in Comparative example 3 and Comparative example 4 had cracks.

Experimental Example 6

Other than that a perovskite precursor material with an n of 30 and a concentration of 1 M was used, the gap of the blade heads was 450 μm, and the time of infrared light irradiation during the manufacturing process, the same materials and the same manufacturing steps and manufacturing conditions as in Experimental example 1 were used.

Comparative Example 5

Other than that infrared light was not irradiated during the manufacturing process, the same materials and the same manufacturing steps and manufacturing conditions as in Experimental example 6 were used.

Figure 7A:
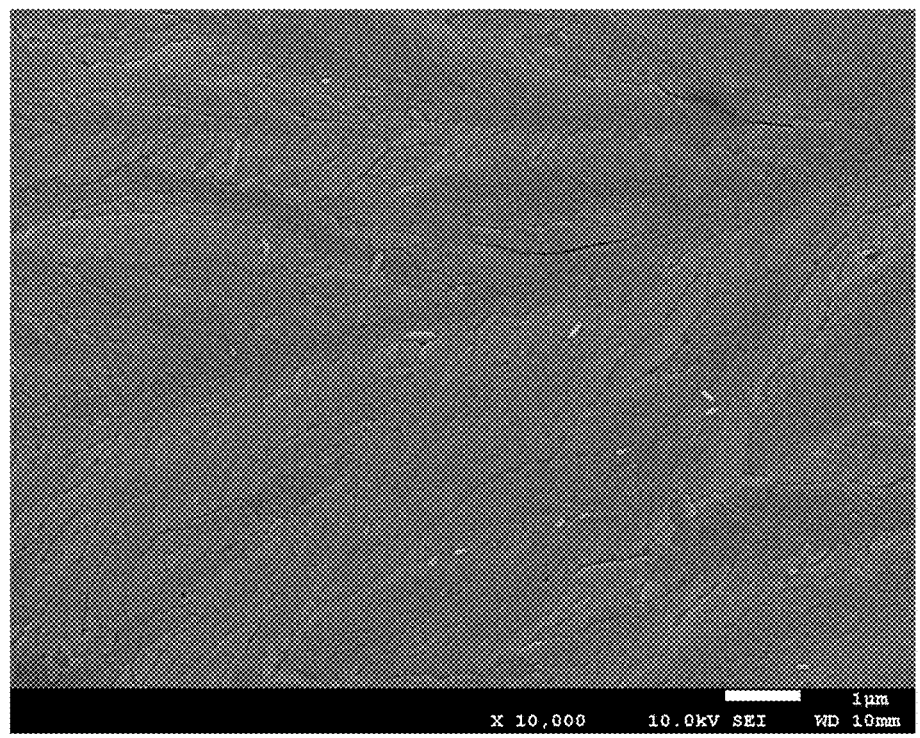
FIG. 7A to FIG. 7D are SEM images of perovskite films of Experimental example 6 and Comparative example 3.
Figure 7B:
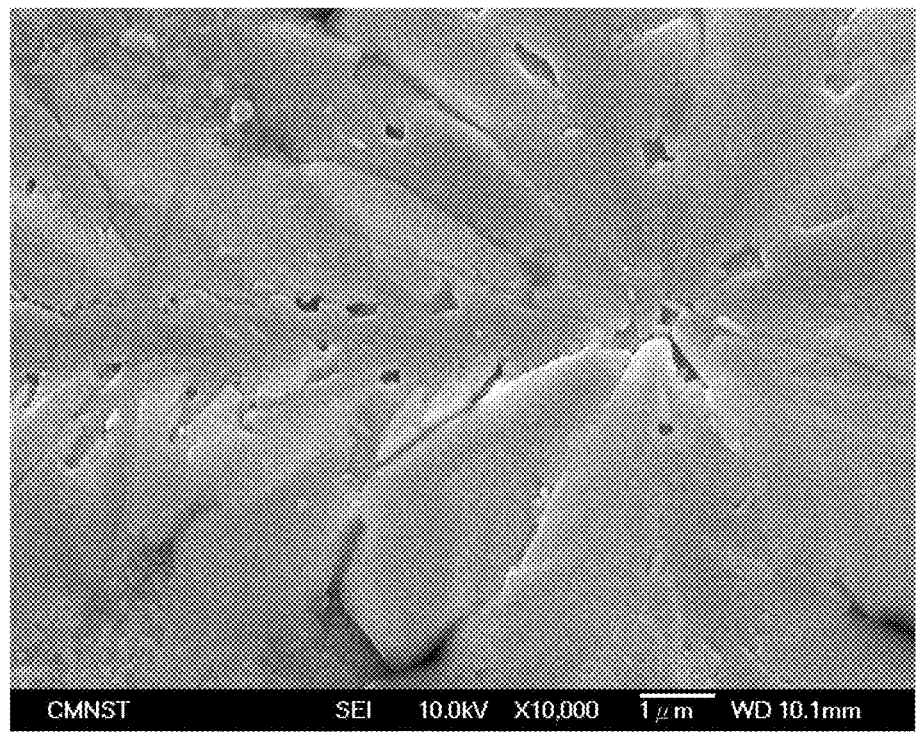
Figure 7C:
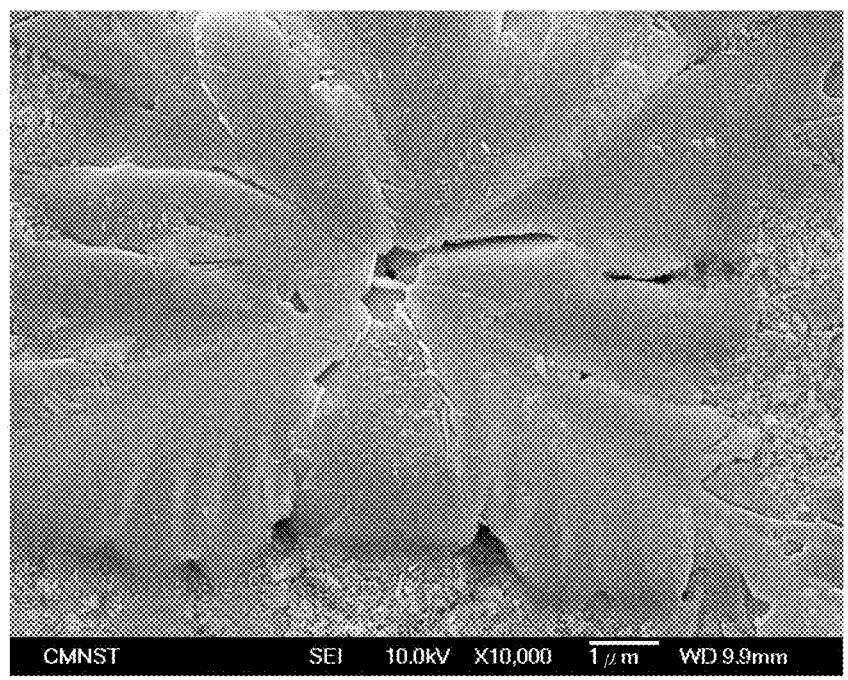
Figure 7D:
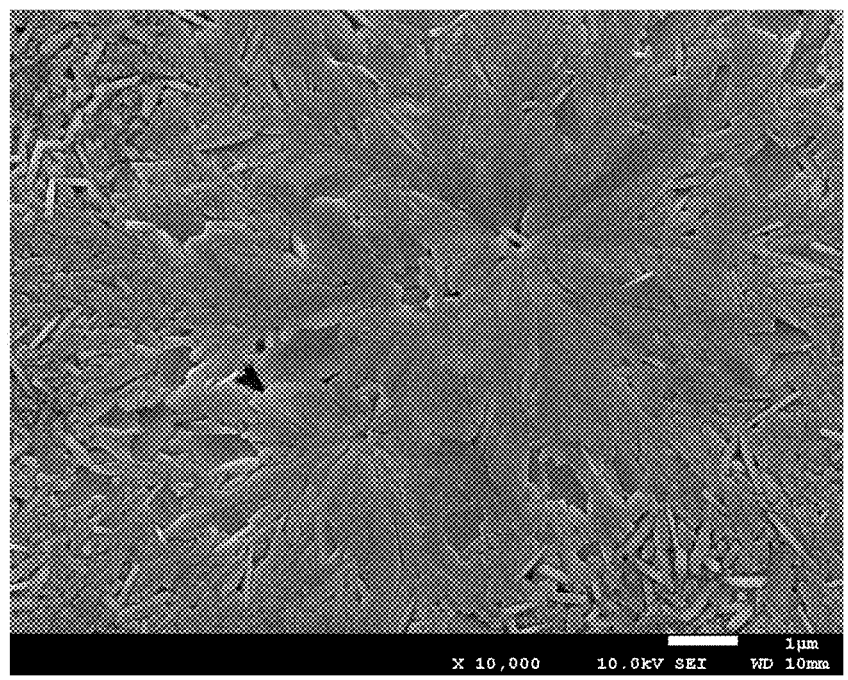

FIG. 7A to FIG. 7C are respectively SEM images of the perovskite film of Experimental example 6 irradiated with infrared light for 20 seconds, 30 seconds, and 60 seconds during the manufacturing process. It may be seen from FIG. 6B and FIG. 7A to FIG. 7C that the perovskite film had larger particles and uniform film formation, but when the infrared light was irradiated for 60 seconds, obvious cracks appeared. FIG. 7D is an SEM image of the perovskite film of Comparative example 5. From FIG. 7A to FIG. 7D, it may be seen that the perovskite film formed in Experimental example 6 was more uniform and had better film forming quality, and in Comparative example 5, the surface was broken and a film may not be formed.

Figure 7E:
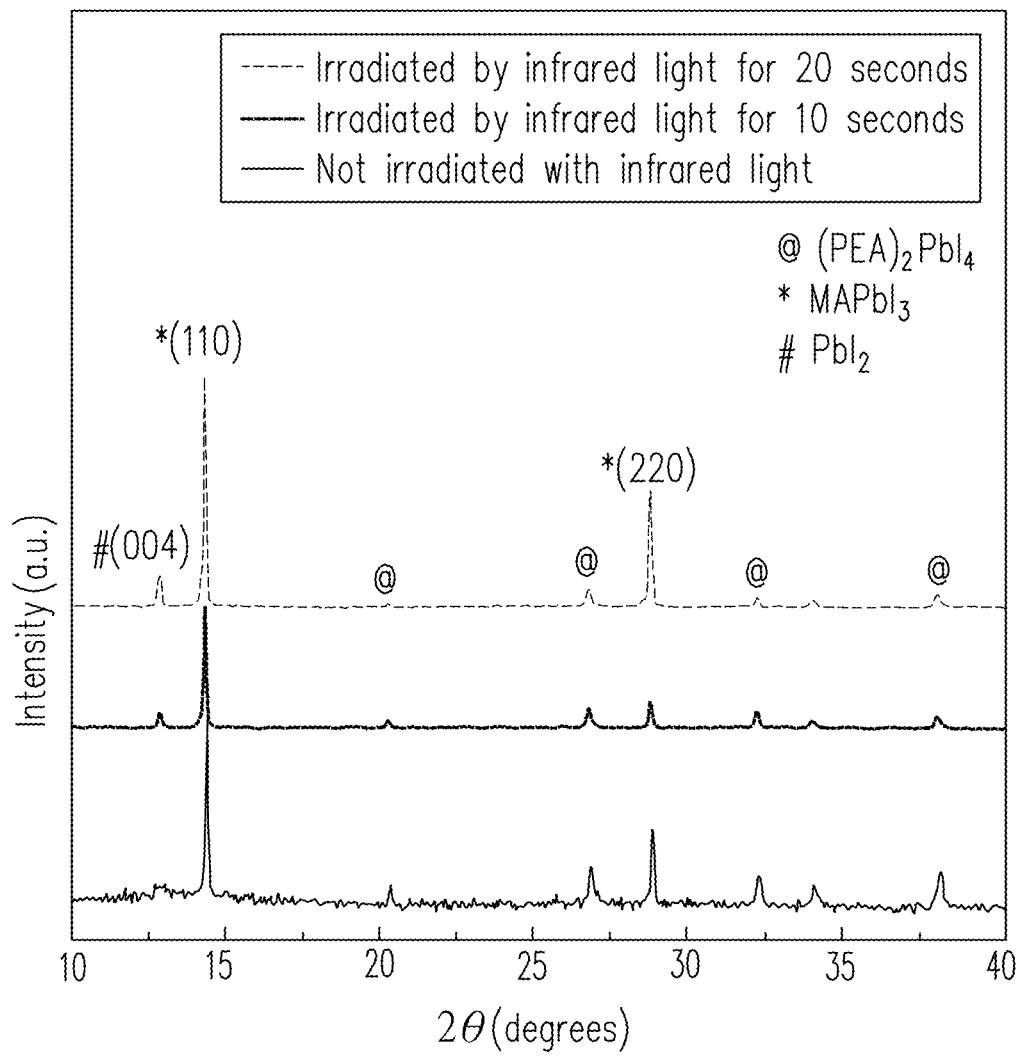
FIG. 7E is an XRD spectrum diagram of perovskite films of Experimental example 6 and Comparative example 3.

In addition, FIG. 7E is an XRD spectrum diagram of perovskite films of Experimental example 6 and Comparative example 5. It may be seen from FIG. 7E that a structure with strong crystallinity in which a 3D phase structure was mixed with a single 2D phase structure may be obtained after 10 seconds of infrared light irradiation, so that the device efficiency may be improved, and the crystal phase remained unchanged after 20 seconds of infrared light irradiation.

Experimental Example 7

Other than irradiating with infrared light for 10 seconds, the same materials and the same manufacturing steps and manufacturing conditions as in Experimental example 6 were used, and the perovskite film was used as the active layer to manufacture the solar cell.

First, the FTO substrate was cleaned with deionized water, ethanol, acetone, and detergent. After the FTO substrate was dried, a TiO$_2$ dense layer was formed by an immersion method, and then a TiO$_2$ porous layer was formed by a spin coating method, and the perovskite film was formed by a blade coating method. After coating, annealing was performed at 100° C. for 60 minutes. Then, a hole transport layer (Spiro-OMeTAD) was coated. Then, an electrode (Au) was deposited by a vacuum deposition system to form a solar cell having a structure composed of fluorine-doped tin oxide (FTO) glass/TiO$_2$ barrier layer/meso-TiO$_2$ hole layer/perovskite film active layer/hole transport layer/Au layer.

Comparative Example 6

Other than that infrared light was not irradiated during the manufacturing process, the same materials and the same manufacturing steps and manufacturing conditions as in Experimental example 7 were used.

Figure 8A:
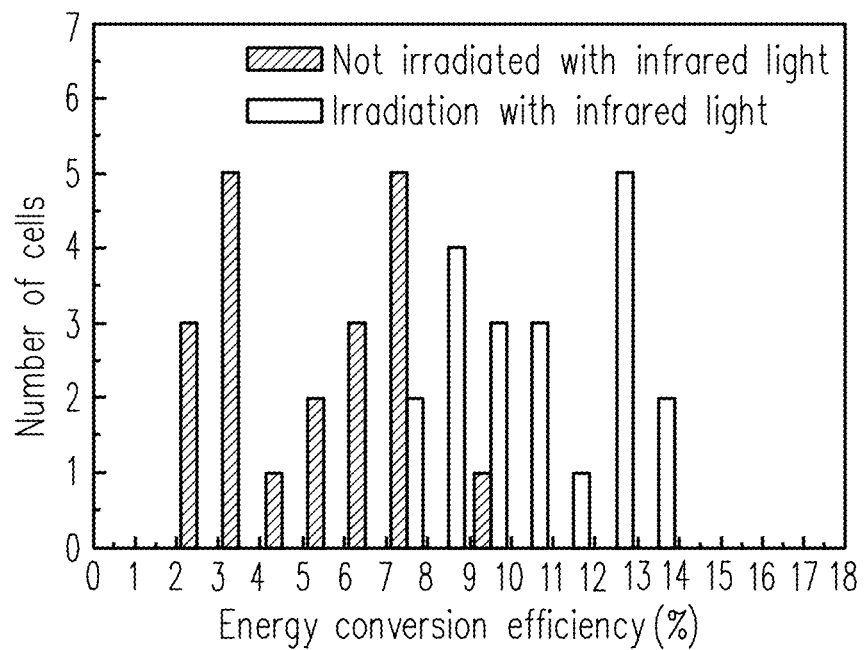
FIG. 8A is a comparison diagram of the power conversion efficiency (PCE) of solar cells of Experimental example 7 and Comparative example 6.

FIG. 8A is a comparison diagram of the energy conversion efficiency of solar cells of Experimental example 7 (irradiated with infrared light for 10 seconds) and Comparative example 6 (no infrared light irradiation). It may be seen from FIG. 8A that in Experimental example 7, due to the infrared light source irradiation during the manufacturing process, the perovskite film was more uniform and had better film forming quality. Therefore, the solar cell of Experimental example 7 may have better energy conversion efficiency.

Figure 8B:
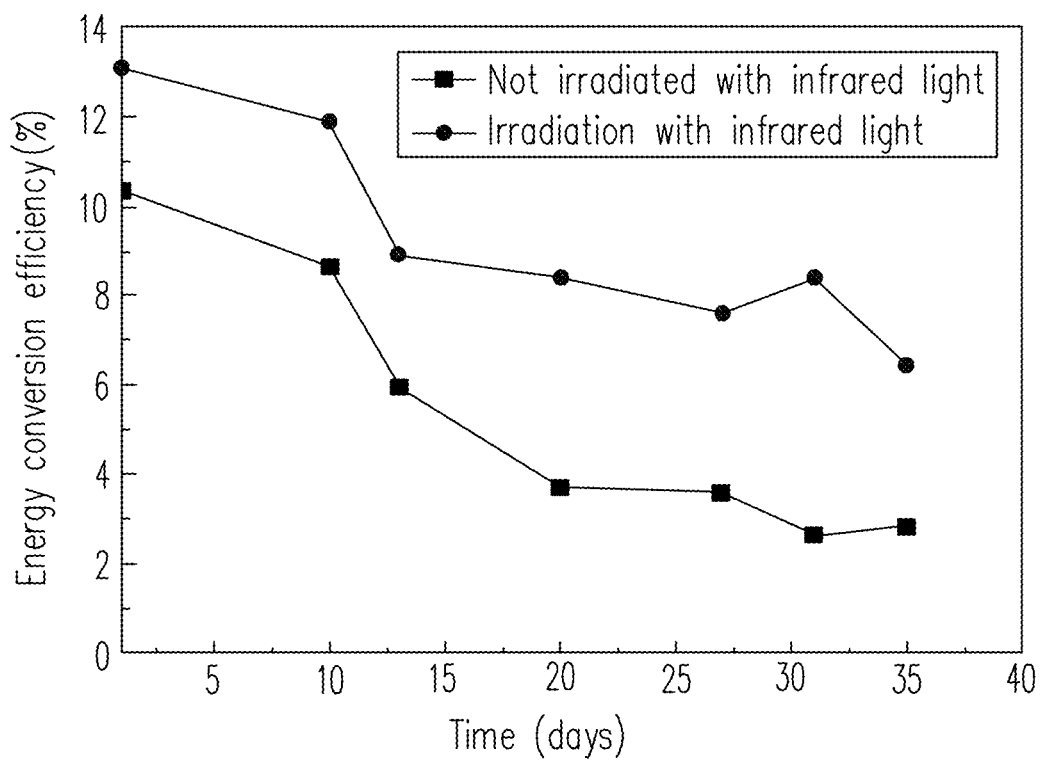
FIG. 8B is a comparison table of a device stability test using thin films of Experimental example 7 and Comparative example 6.
Figure 9A:
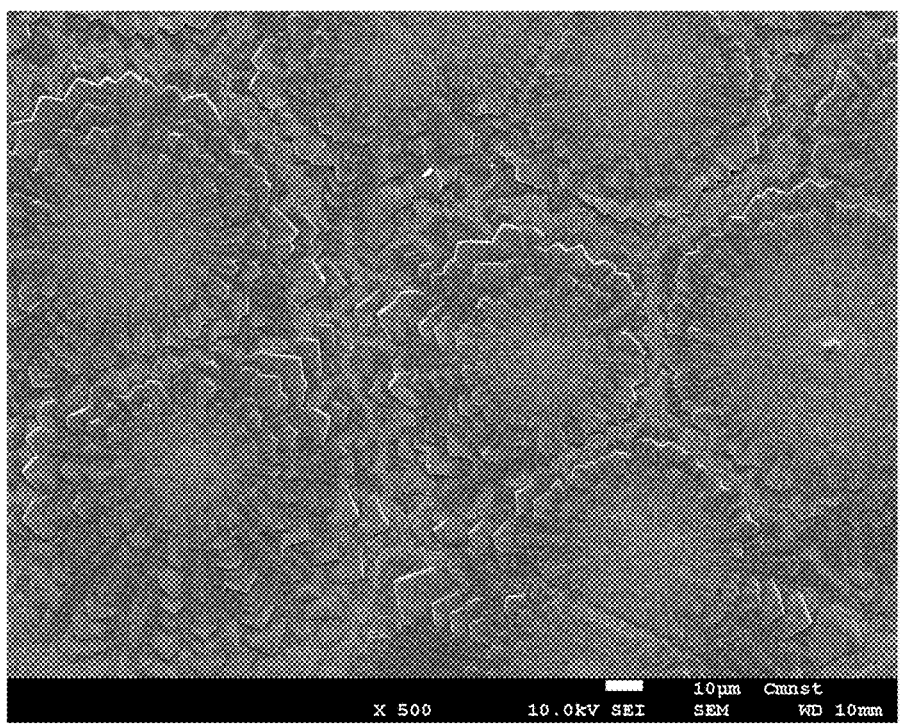
FIG. 9A to FIG. 9E are SEM images of a perovskite film at different substrate temperatures in Experimental example 8.
Figure 9B:
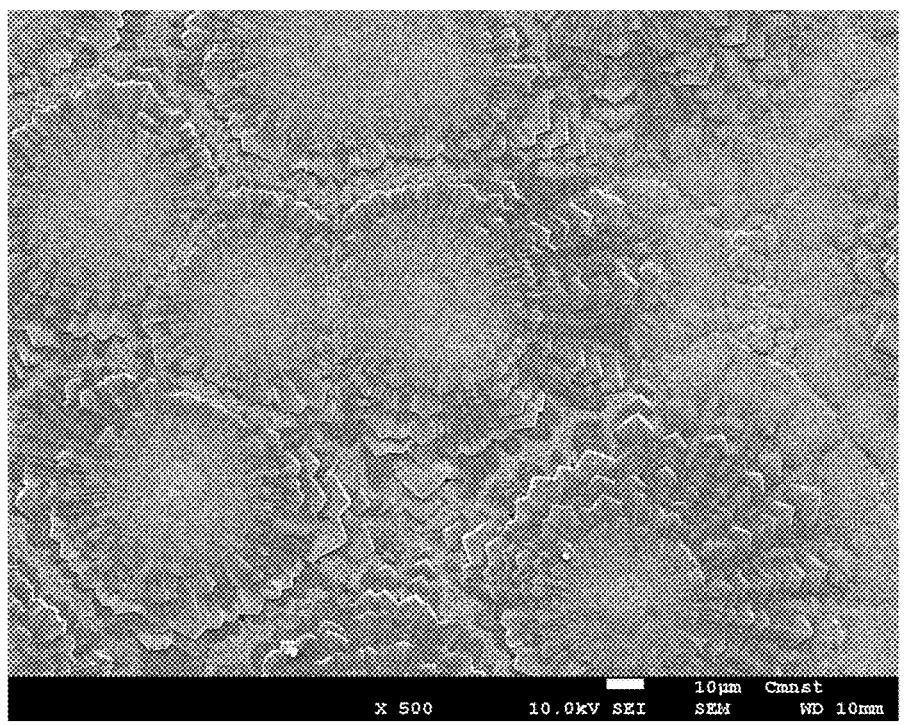
Figure 9C:
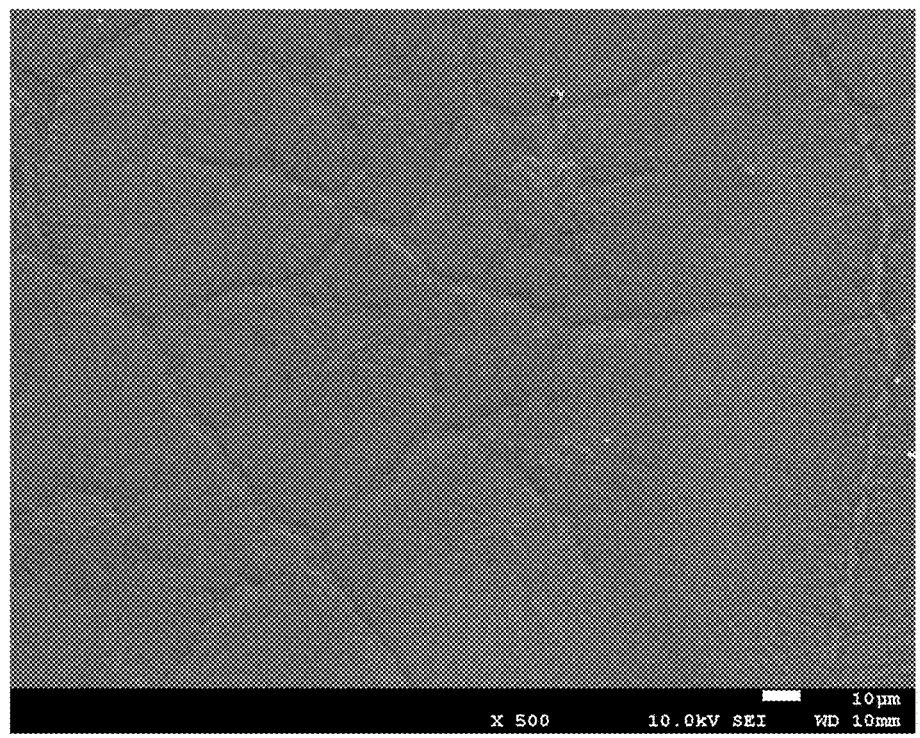
Figure 9D:
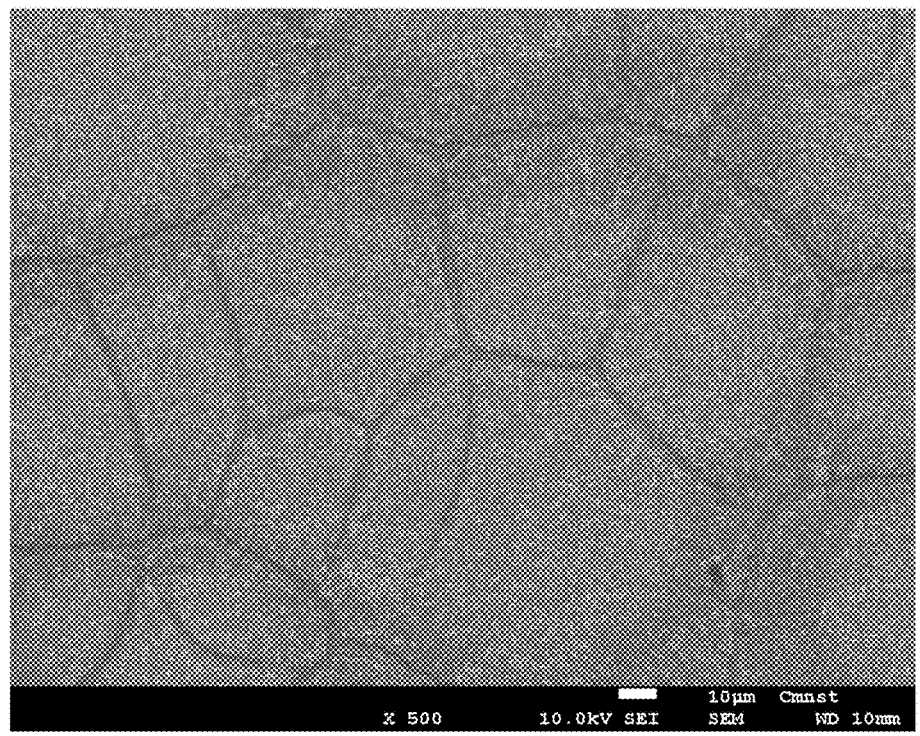
Figure 9E:
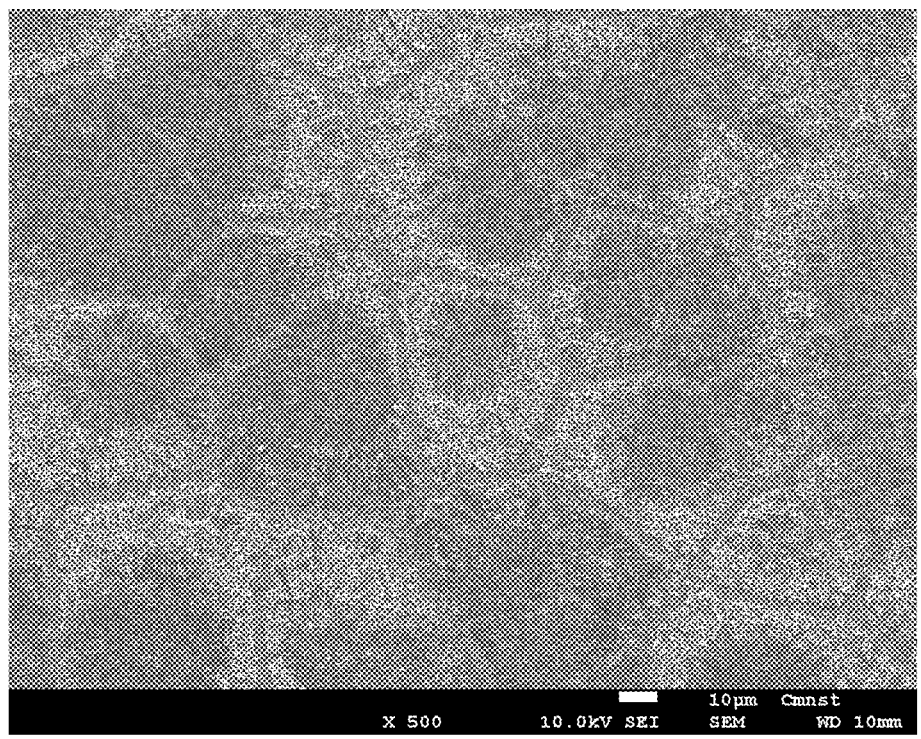

In addition, FIG. 8B is a comparison table of a device stability test of solar cells of Experimental example 7 (irradiated by infrared light for 10 seconds) and Comparative example 6 (no infrared light irradiation), wherein the solar cells were not packaged and were kept in a test environment (temperature of 26° C. to 27° C., humidity of 40% to 45%, no illumination). It may be seen from FIG. 8B that the device stability of Experimental example 7 was significantly higher than that of Comparative example 6.

Experimental Example 8

Other than that a perovskite precursor material with an n of 30 and a concentration of 1 M was used, the temperature of the substrate was respectively maintained at 130° C., 140° C., 150° C., 160° C., and 170° C., the gap of the blade heads was 450 μm, and the infrared light irradiation was 10 seconds during the manufacturing process, the same materials and the same manufacturing steps and manufacturing conditions as in Experimental example 1 were used.

FIG. 9A to FIG. 9E are respectively SEM images of perovskite films formed by maintaining the temperature of the substrate respectively at 130° C., 140° C., 150° C., 160° C., and 170° C. during the manufacturing process. It may be seen from FIG. 9A to FIG. 9E that when the temperature was maintained between 130° C. and 170° C. during the manufacturing process, the perovskite film had a uniform surface and no obvious cracks occurred.

Experimental Example 9

Other than that AVAI (5-ammonium valeric acid iodide) was used to replace PEAI, a perovskite precursor material with an n of 30 and a concentration of 1 M was used, the gap of the blade heads was 450 μm, and the infrared light irradiation was 15 seconds during the manufacturing process, the same materials and the same manufacturing steps and manufacturing conditions as in Experimental example 1 were used.

Comparative Example 7

Other than that infrared light was not irradiated during the manufacturing process, the same materials and the same manufacturing steps and manufacturing conditions as in Experimental example 9 were used.

Figure 10A:
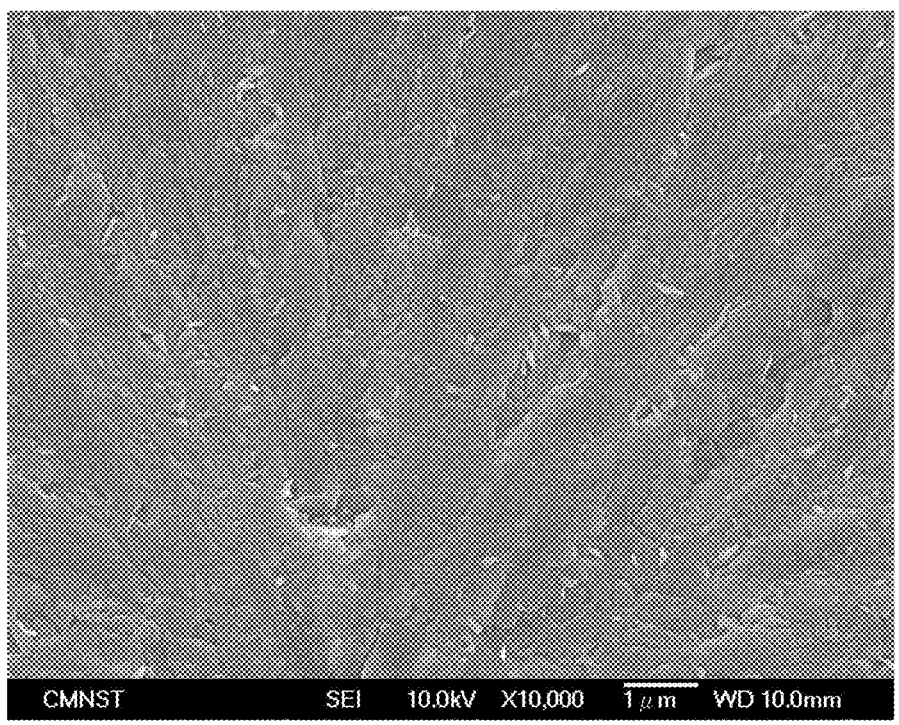
FIG. 10A and FIG. 10B are SEM images of perovskite films of Experimental example 9 and Comparative example 7, respectively.
Figure 10B:
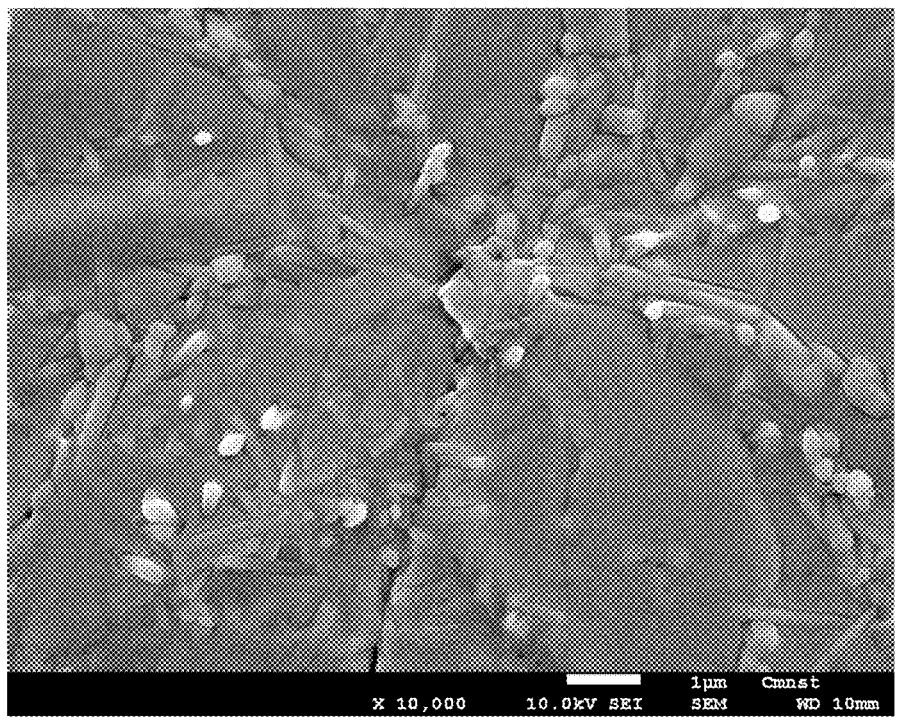

FIG. 10A and FIG. 10B are SEM images of perovskite films of Experimental example 9 and Comparative example 7, respectively. It may be seen from FIG. 10A and FIG. 10B that the perovskite film of Experimental example 9 had good film-forming properties and did not have obvious cracks.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of a perovskite film, comprising:
coating a perovskite precursor material in a linear direction on a substrate with a temperature between 100° C. and 200° C., wherein a concentration of the perovskite precursor material is between 0.05 M and 1.5 M; and
performing an infrared light irradiation on the perovskite precursor material to cure the perovskite precursor material to form a thin film comprising a compound represented by formula (1), $$(RNH_3)_2MA_{(n-1)}M^1{}_nX_{(3n+1)} \qquad \text{formula (1),}$$

wherein each R is independently H, a $C_1$ to CM alkyl group, a $C_1$ to $C_{20}$ cycloalkyl group, a $C_1$ to $C_{20}$ carboxyl group, or a $C_1$ to $C_{20}$ aralkyl group; MA is methylamine; $M^1$ is Ca, Sr, Cd, Cu, Ni, Mn, Fe, Co, Pd, Ge, Sn, Pb, Yb, Eu, or a combination thereof; X is Cl, Br, I, or a combination thereof; n is an integer of 1 to 50, wherein the perovskite film has a single 2D phase structure or has a structure in which a 3D phase structure is mixed with a single 2D phase structure.

2. The manufacturing method of the perovskite film of claim 1, wherein a method of coating the perovskite precursor material comprises slit coating, blade coating, air knife coating, or inkjet coating.

3. The manufacturing method of the perovskite film of claim 1, wherein the infrared light irradiation uses an infrared light with a wavelength between 700 nm and 1400 nm.

4. The manufacturing method of the perovskite film of claim 1, wherein the concentration of the perovskite precursor material is between 0.05 M and 0.6 M, and the perovskite film has the single 2D phase structure.

5. The manufacturing method of the perovskite film of claim 4, wherein a time of the infrared light irradiation is between 5 seconds and 120 seconds.

6. The manufacturing method of the perovskite film of claim 4, wherein the concentration of the perovskite precursor material is between 0.2 M and 0.6 M.

7. The manufacturing method of the perovskite film of claim 6, wherein a time of the infrared light irradiation is between 5 seconds and 20 seconds.

8. The manufacturing method of the perovskite film of claim 4, wherein the concentration of the perovskite precursor material is less than 0.2 M.

9. The manufacturing method of the perovskite film of claim 8, wherein a time of the infrared light irradiation is between 60 seconds and 120 seconds.

10. The manufacturing method of the perovskite film of claim 1, wherein the concentration of the perovskite precursor material is greater than 0.6 M and not more than 1.5 M, and the perovskite film has the structure in which the 3D phase structure is mixed with the single 2D phase structure.

11. The manufacturing method of the perovskite film of claim 10, wherein a time of the infrared light irradiation is between 5 seconds and 40 seconds.

12. A perovskite film having a single 2D phase structure, wherein the perovskite film comprises a compound represented by formula (1), $$(RNH_3)_2 MA_{(n-1)} M^1{}_n X_{(3n+1)} \qquad \text{formula (1)},$$

wherein each R is independently H, a $C_1$ to CM alkyl group, a $C_1$ to $C_{20}$ cycloalkyl group, a $C_1$ to $C_{20}$ carboxyl group, or a $C_1$ to $C_{20}$ aralkyl group; MA is methylamine; $M^1$ is Ca, Sr, Cd, Cu, Ni, Mn, Fe, Co, Pd, Ge, Sn, Pb, Yb, Eu, or a combination thereof; X is Cl, Br, I, or a combination thereof; n is an integer of 1 to 50, wherein in a photoluminescence spectrum, a peak appears in a wavelength range of 550 nm to 650 nm, and an FWHM thereof is between 20 nm and 40 nm, or a peak appears in a wavelength range of 700 nm to 800 nm, and an FWHM thereof is between 30 nm and 65 nm.

13. The perovskite film of claim 12, wherein a thickness of the perovskite film is between 5 nm and 4 μm.

\* \* \* \* \*